(12) United States Patent
de Haas

(10) Patent No.: US 9,154,116 B2
(45) Date of Patent: Oct. 6, 2015

(54) INPUT CIRCUIT WITH MIRRORING

(71) Applicant: NXP B.V., Eindhoven (NL)

(72) Inventor: Clemens Gerhardus Johannes de Haas, Ewijk (NL)

(73) Assignee: NXP B.V., Eindhoven (NL)

( * ) Notice: Subject to any disclaimer, the term of this patent is extended or adjusted under 35 U.S.C. 154(b) by 79 days.

(21) Appl. No.: 14/086,150

(22) Filed: Nov. 21, 2013

(65) Prior Publication Data
US 2015/0137856 A1    May 21, 2015

(51) Int. Cl.
*H03K 3/00* (2006.01)
*H03K 3/012* (2006.01)
*H03K 5/08* (2006.01)

(52) U.S. Cl.
CPC . *H03K 3/012* (2013.01); *H03K 5/08* (2013.01)

(58) Field of Classification Search
None
See application file for complete search history.

(56) References Cited

U.S. PATENT DOCUMENTS

| | | |
|---|---|---|
| 5,870,000 A | 2/1999 | Matsuda et al. |
| 6,525,572 B1 * | 2/2003 | Barnes ............................ 327/52 |
| 2001/0045868 A1 | 11/2001 | Takeyabu et al. |
| 2007/0182386 A1 * | 8/2007 | Garner ........................ 323/225 |
| 2013/0021189 A1 | 1/2013 | Kabir et al. |
| 2013/0293273 A1 * | 11/2013 | Paul .............................. 327/143 |

FOREIGN PATENT DOCUMENTS

WO    2004/021539 A2    3/2004

OTHER PUBLICATIONS

Extended European Search Report for European Patent Appln. No. 14187553.4 (Jan. 15, 2015).

* cited by examiner

*Primary Examiner* — Lincoln Donovan
*Assistant Examiner* — Khareem E Almo

(57) ABSTRACT

Various aspects are directed to providing an output/state based upon an input value. Consistent with one or more embodiments, an apparatus includes a bias circuit that is connected between power and common rails and includes first and second current paths that provide first and second reference currents. A current-mirroring circuit provides a first mirrored current in response to a voltage input transitioning in a first direction between voltage levels, and a second mirrored current in response to a voltage input transitioning in an opposite direction. A logic circuit operates in a first state based upon the first mirrored current and the first reference current, and operates in a second state based upon the second mirrored current and the second reference current.

21 Claims, 6 Drawing Sheets

INPUT CIRCUIT WITH MIRRORING

Aspects of various embodiments are directed to input circuits, and to input circuits employing mirroring circuits.

Communications between respective circuits are often effected using input circuits, such as input driver circuits. In many such applications, reference voltages are needed to protect output devices in the event that a high voltage is present on a power supply (VDD) and/or input (IN) pin. This means the current consumed by the circuit that generates these voltages is always present. However, this can be undesirable as low power requirements are important for many circuits, such that non-functional circuits are desirably disabled, and that quiescent current is held low.

As semiconductor processes advance, lower core supply voltages are employed to support lower dissipation requirements. For instance, certain applications employ voltage at 1.8V/1.2V or lower. While a common supply voltage of input/output circuits is often 3.3V, various applications require or benefit from higher voltages. However, many common semiconductor processes employ gate-oxides for lower-voltage (e.g., 3.3V) applications, such that higher voltage (e.g., 5V) applications require an additional gate-oxide mask, which can increase manufacturing cost.

These and other matters have presented challenges to communication circuits, including those employing input drivers, for a variety of applications.

Various example embodiments are directed to input circuits and their implementation, as may involve input drivers used in communication circuits, and which may address challenges such as those described above.

According to an example embodiment, an apparatus includes a set-reset latch, a bias circuit and respective current-mirroring circuits that operate via power and common rails. The set-reset latch provides first and second output states based upon respective set and reset values presented thereto. The bias circuit is connected to the power and common rails, and has first and second current paths that respectively provide first and second reference currents. A first one of the current-mirroring circuits is connected to the power rail and is responsive to a voltage level presented at an input port transitioning in a first direction between voltage levels, by providing a first mirrored current and operating the set-reset latch in the first output state. The set-reset latch is operated in the first output state based upon both the first mirrored current and the first reference current. A second one of the current-mirroring circuits is connected to the common rail and is responsive to a voltage level presented at the input port transitioning in a second direction that is opposite the first direction by providing a second mirrored current. The set-reset latch is operated in the second output state based upon both the second mirrored current and the second reference current.

Another example embodiment is directed to an apparatus including a bias circuit, a current-mirroring circuit and a logic circuit. The bias circuit is connected between power and common rails and has first and second current paths that respectively provide first and second reference currents. The current-mirroring circuit provides a first mirrored current in response to a voltage level presented at an input port transitioning in a first direction between voltage levels, and a second mirrored current in response to a voltage level presented at the input port transitioning in a second direction that is opposite the first direction. The logic circuit operates with the bias and current-mirroring circuits to generate an output corresponding to a voltage level on the input port, by operating in a first state based upon the first mirrored current and the first reference current, and by operating in a second state based upon the second mirrored current and the second reference current.

Another embodiment is directed to a method in which a set-reset latch is provided and operated in first and second output states based upon respective set and reset values. First and second reference currents are respectively provided via first and second current paths between power and common rails. In response to a voltage level presented at an input port transitioning in a first direction between voltage levels, the set-reset latch is operated in the first output state by providing a first mirrored current (using the power rail) and the first reference current to the latch. In response to a voltage level presented at the input port transitioning in a second direction that is opposite the first direction, the set-reset latch is operated in the second output state by providing a second mirrored current (using the common rail) and the second reference current to the latch.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
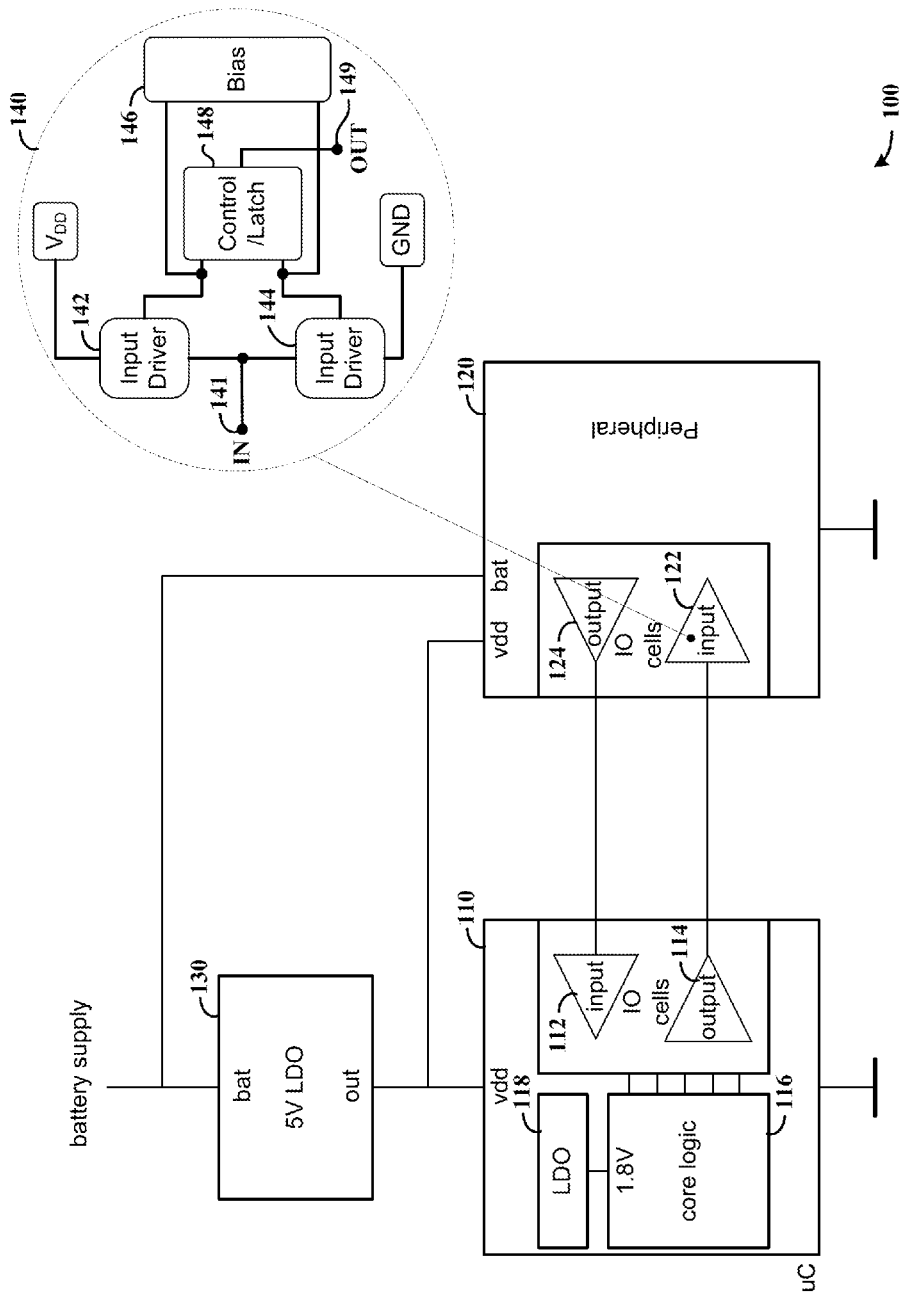
FIG. 1 shows a communication apparatus, in accordance with an embodiment.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving communications between circuits, and input drivers for such communications. While not necessarily so limited, various aspects may be appreciated through a discussion of examples using this context.

Various example embodiments are directed to an input driver-type circuit that operates with relatively high supply and input voltages, and provides a low-current or zero-current mode in a low-power state. Such high-voltage applications may pertain to voltages greater than an operational limit of a gate-oxide for one or more transistors used in the input driver. In various implementations, thresholds implemented for operation based on rising and falling input voltage levels are defined by matching, and do not depend on process parameters and/or temperatures, and can mitigate issues such as those discussed above.

Such an input driver/comparator-type circuit is used in a variety of applications, in accordance with various embodiments. In some embodiments, an input comparator is used with logic circuits that interface between two integrated circuits (ICs). Such embodiments may, for example, be used in connection with an automotive network and ECU in which a microcontroller communicates with a peripheral device via IO cells (e.g., with a VDD supply between 3V and 5V). In some implementations, the circuit is operable to withstand VDD supplies up to at least 7V when disabled, under which conditions current consumption is 0 uA (with limited current passing as leakage). Such approaches can be implemented, for example, with gate-oxide transistors designed for lower (e.g., 3.3V) voltages.

Another embodiment is directed to a method in which a set-reset latch is provided and operated in respective output states based upon respective set and reset values. Bias and second reference currents are generated in respective current paths, and used with mirrored currents to operate the latch as follows. When a voltage level presented at an input port transitions in a first direction between voltage levels, the latch is operated in a first state (e.g., a "set" state) based upon a current that mirrors current through a transistor connected between the power rail and input port, using one of the bias currents to set a threshold at which the first state is set. When a voltage level presented at the input port transitions in a second direction that is opposite the first direction, the latch is operated in a second state (e.g., a "reset" state) based upon a current that mirrors current through another transistor connected between the common rail and the input port, using another one of the bias currents to set a threshold at which the second state is set.

The above approach may be implemented using a variety of different voltage levels and bias currents. In some embodiments, a high voltage level is provided via the power rail and a relatively lower voltage level is provided via the common rail. As such, the first direction involves a transition away from the high voltage level (e.g., in which about no current flows in the circuit when the input port is at a voltage corresponding to the power rail), and the second direction involves a transition away from the common voltage level (e.g., ground). Under such conditions, the current mirroring circuits operate to provide a mirrored current using voltage levels that are lower, relative to the power rail, for sensing voltage at the input port and providing a mirrored current. Such an approach may, for example, be used to implement transistors having a gate oxide operable at a voltage level that is lower than that provided via the power rail. This can be useful, for example, when operating in circuits providing a high voltage, such as in an automotive circuit operating at battery voltage level.

In a more particular embodiment, the first mirrored current is provided using a first transistor having a source and drain respectively coupled in series between the power rail and the input port, and using at least one transistor to generate a current that mirrors current in the first transistor that is based upon a signal presented at the input port. The second mirrored current involves using a second transistor having a source and drain respectively coupled in series between the input port and the common rail, and using at least one transistor to generate a current that mirrors current in the second transistor based upon a signal presented at the input port.

Another example embodiment is directed to an apparatus including a bias circuit, a current-mirroring circuit and a logic circuit, as may be implemented to provide bias and mirroring currents for setting states of the logic circuit, using the approaches described above. The bias circuit provides first and second reference currents via respective current paths, and the current-mirroring circuit provides first and second mirrored currents based on a direction in which a voltage level presented at an input port transitions. The logic circuit is responsive to inputs provided via the bias and current-mirroring circuits, by operating in respective states (e.g., set/reset states). Using this approach, the bias and current-mirroring circuits provide an input to the logic circuit in the current domain, in response to an input in the voltage domain.

In a particular implementation, the current-mirroring circuit includes a first transistor having a source and drain coupled in series between a power rail and the input port, and at least one transistor that provides a current that mirrors a current through the first transistor and that flows current based upon a signal presented at the input port. The current mirroring circuit also includes a second transistor having a source and drain coupled in series between the input port and the common rail, and at least one transistor that provides a current that mirrors a current through the second transistor and to flow current based upon a signal presented at the input port. The current-mirroring circuit operates the set-reset latch in the first output state based upon a ratio between the first mirrored current and the first reference current, and operates the set-reset latch in the second output state based upon a ratio between the first mirrored current and the first reference current.

According to a more particular embodiment, an apparatus operates to provide a logic state based upon a voltage level presented on an input port, using power and common rails. The apparatus includes a set-reset latch, a bias circuit and respective current-mirroring circuits. The set-reset latch provides first and second output states based upon respective set and reset inputs. The bias circuit has respective first and second current paths that provide first and second reference currents, which can be tailored to set threshold current at which the latch enters one of the respective states.

One of the current-mirroring circuits is connected to the power rail and provides a first mirrored current in response to a voltage level presented at an input port transitioning in a first direction between voltage levels. The set-reset latch operates in a first output state (e.g., a "set" state) based upon a value of the first mirrored current, relative to a value of the first reference current as set via the bias circuit. A second one of the current-mirroring circuits is connected to the common rail and provides a second mirrored current in response to a voltage level presented at the input port transitioning in an opposite direction. The set-reset latch operates in the second output state (e.g., a "reset" state) based upon both the second mirrored current, relative to a value of the second reference current. In some embodiments, the bias circuit has resistors that set values of the first and second reference currents, thereby setting threshold mirror currents upon which the set-reset latch is respectively switched to the first and second output states. As such, the ratio, or relative value between, the mirror and bias currents control the set and reset of the latch.

Using such an approach, the latch operates to provide an output that corresponds to a voltage at the input port. Further, such an approach can be implemented, via the mirroring approach, to protect switches from undesirably high voltage and to block current (e.g., except for leakage) when the input port is at a steady voltage. For instance, in some embodiments the power rail provides a high voltage level and the common rail provides a relatively lower voltage level. The current mirroring circuits include transistors having a gate oxide operable at a voltage level that is between the high and low voltage levels, as may be useful for implementing manufacturing processes used in making circuits that operate at a relatively low voltage level. An impedance circuit is coupled to the input port and to the current mirroring circuits, and provides such a low voltage level to the transistors, thereby rendering the transistors operable in a higher-voltage system.

In a more particular embodiment, the first current-mirroring circuit includes a first transistor having a source and drain respectively coupled in series between the power rail and the input port. One or more transistors provide a current that mirrors current through the first transistor, and flow current based upon a signal presented at the input port. The second current-mirroring circuit also includes a second transistor having a source and drain respectively coupled in series between the input port and the common rail. One or more transistors provide a current that mirrors a current through the second transistor and flow current based upon a signal presented at the input port.

In a more particular implementation, a first resistor is connected in series between the input port and a gate of the first transistor, and between the input port and a gate of the second transistor. A second resistor is connected in series between the gate and source of the first transistor, and between the gate and source of the second transistor, the first and second resistors being equal in resistance. These resistors may, for example, set a level of the first and second mirrored currents and operate to facilitate the control of voltage presented at the transistors.

In some embodiments, the set-reset latch has a set input and a reset input, provides the first output state based upon a set value presented to the set input, and provides the second output state based upon a reset value presented to the reset input. The first current-mirroring circuit provides the first mirrored current to the set input, and the second current-mirroring circuit provides the second mirrored current to the reset input. The first current path includes a third transistor connected in series between the set input and the common rail, in which the third transistor matches the first transistor, and the second current path includes a fourth transistor connected in series between the power rail and the reset input, in which the fourth transistor matches the second transistor.

In another embodiment, the first current-mirroring circuit includes a transistor having a source connected to the power rail and a drain connected to the source of the first transistor, and another transistor having a source connected to the power rail and a drain connected to a set input of the set-reset latch. The gates of these transistors are connected to one another, and (with the first current path of the bias circuit) provide a current that mirrors current in the first transistor to the set input. The second current-mirroring circuit also includes a transistor having a source connected to the power rail and a drain connected to the source of the first transistor, and another transistor having a source connected to the power rail and a drain connected to a reset input of the set-reset latch, with the gates of these transistors being connected to one another. These transistors operate with the second current path of the bias circuit to provide a current that mirrors current in the second transistor to the reset input.

Turning now to the figures, FIG. 1 shows a communication apparatus 100, in accordance with another embodiment. The apparatus 100 includes a variety of components, which may be implemented separately in respective embodiments, combined in part or as a whole, for a variety of applications. One such application involves an automotive communication circuit and/or system. A microcontroller 110 communicates with a peripheral device 120, each of which is powered by a battery supply and via regulator 130 (shown by way of example as being a 5V LDO regulator, providing $V_{DD}$). The microcontroller 110 includes input and output drivers 112 and 114, which respectively communicate with output and input drivers 124 and 122.

In some embodiments, the input driver 122 includes circuits as shown in the inset 140. An input driver 142 is connected to $V_{DD}$ and an input port 141, and another input driver 144 is connected to the input port and a reference or ground-level voltage (e.g., as represented by GND). A bias circuit 146 operates with the input drivers 142 and 144 to provide an input to a control latch 148, to provide an output at output port 149 based on a value at input port 141.

The control latch 148 may, for example, be implemented with a set/reset latch in which the output is provided based upon a value corresponding to set and reset states. The input driver 142 and bias circuit 146 operate to provide an input corresponding to one of the set/reset conditions, and the input driver 144 and bias circuit 146 provide an input corresponding to the other one of the set/reset conditions. A value of the bias circuit can be set for controlling respective thresholds at which the set/reset conditions are provided.

In some embodiments, the input drivers 142 and 144 implement respective current-mirroring circuits connected between a common voltage rail and a power rail supplied by $V_{DD}$. The current-mirroring circuits are responsive to voltage levels presented at the input port 141 by transitioning in respective direction between voltage levels, and to provide respective inputs to the control latch 148 via mirrored current corresponding to the voltage levels.

In some embodiments, the input driver 142 operates with the bias circuit 146 to provide a first mirrored current and a first bias/reference current, which operate the control latch 148 in a first output state, in response to the voltage level at the input port transitioning in a first direction. The input driver 144 operates with the bias circuit 146 to provide a second mirrored current and second reference/bias current, which operate the control latch 148 in a second output state, in response to a voltage level presented at the input port transitioning in a second direction that is opposite the first direction. The bias circuit provides the respective reference/bias currents using first and second current paths between the power supply and common voltage rails.

Figure 2:
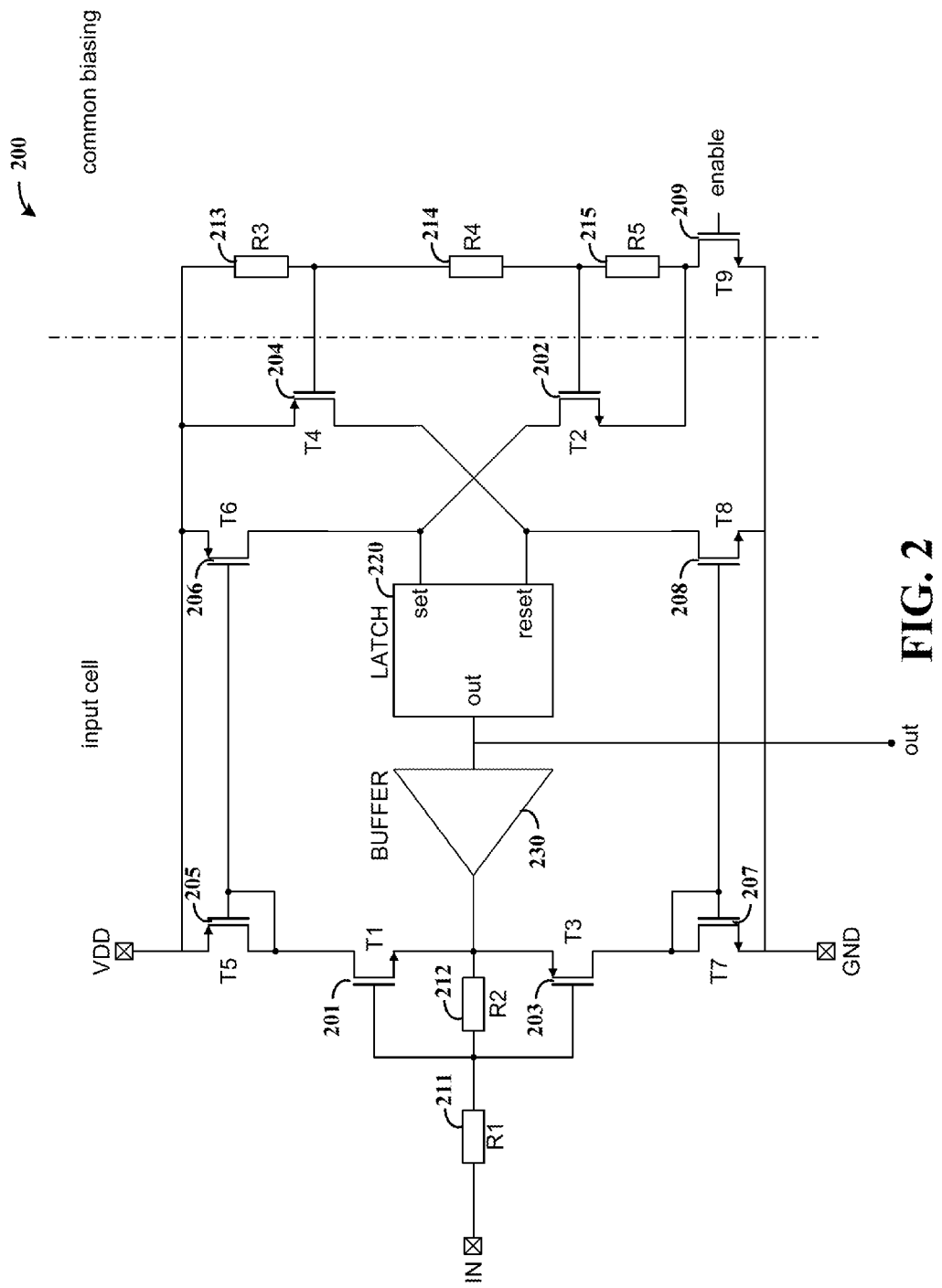
FIG. 2 shows an input driver circuit, in accordance with another embodiment.

FIG. 2 shows an input driver circuit 200, in accordance with another embodiment. The circuit 200 includes transistors 201-209 (T1-T9) coupled between an input power rail (at VDD) and a ground rail (at GND). Transistors 201 and 203 are respectively located on power and ground sides of the circuit 200, relative to an input port that is coupled to gates of the transistors 201 and 203, via resistor 211. These gates are coupled to drain/source regions of transistors 201 and 203 via resistor 212. A biasing circuit having resistors 213, 214 and 215 coupled in series between the power and ground rails divide VDD to provide gate voltages to transistors 202 and 204. In some embodiments, the circuit 200 also includes transistor 209, which operates to enable or disable the biasing circuit. In some implementations, when transistor 209 is disabled, all gate-source voltages are set to zero and the current consumption becomes zero (e.g., about zero, plus any leakage).

The input driver circuit 200 further includes a latch 220 having set and reset inputs as shown, and which generates an output signal based upon the state of the latch being set by an input provided at the set or reset inputs. By way of example, a buffer circuit 230 is also shown connected between the output of the latch 220 (and of the input driver circuit 200), and the input port (via resistors 211 and 212).

In some embodiments, the input driver circuit 200 converts an input voltage received at the input port to a current that flows through transistors 201 and 203 ($I_{T1}/I_{T3}$), and that current is effectively compared with a reference current provided via control of the bias circuit through transistors 202 and 204 ($I_{T2}/I_{T4}$), which creates defined thresholds at which the set and reset inputs of the latch 220 are provided. The switching thresholds of the latch can thus be set by setting the relative values of the resistors 211/212 (R1/R2) and 213/214/215 (R3/R4/R5).

Accordingly, the current consumption of the input driver circuit 200 is zero (e.g., plus leakage) when the voltage at the input port is at the VDD or GND levels. When the input voltage transitions between high and low, current flows in the VDD supply (e.g., similar to a CMOS input cell). The intrinsic behavior of the input driver circuit may, for example, be operated similarly to an input cell having a repeater configuration in which a pull-up or pull-down resistor is defined by R1+R2.

In some embodiments, the transistors 201-209 are 3.3V gate-oxide devices operable to withstand a 7V or higher drain/source breakdown, with resistors 201 and 202 being set to equal values such that the gate-source voltage of transistors 201 and 203 are limited to half the value of VDD. Such an approach can be used with a voltage source (e.g., provided via an automotive battery) to set VDD to 7V, as 3.3V gate-oxide transistors can withstand a voltage of about 3.6V, with the gate-source voltage thus being limited to half VDD (about 3.5V).

The circuit also has an intrinsic hysteresis build-in, as the high and low-level thresholds with regard to switching may be different. Further, the switching thresholds may be implemented in a manner that is generally immune to temperature and process spread, by matching of transistors 201/202, 203/204, 205/206, and 208/207, as well as by resistors 211/212, and 213/214/215. This approach, which may involve symmetrical mirroring circuits as shown, can be used to facilitate symmetrical propagation delay over temperature and process spread.

Various other voltage levels and gate-oxide limited circuits are implemented, in accordance with one or more embodiments. For instance, other resistor values and other types of transistors with different operational voltages, as well as an input comparator, are implemented in embodiments involving other supply voltages that are higher than the gate-oxide breakdown of the components.

Figure 3:
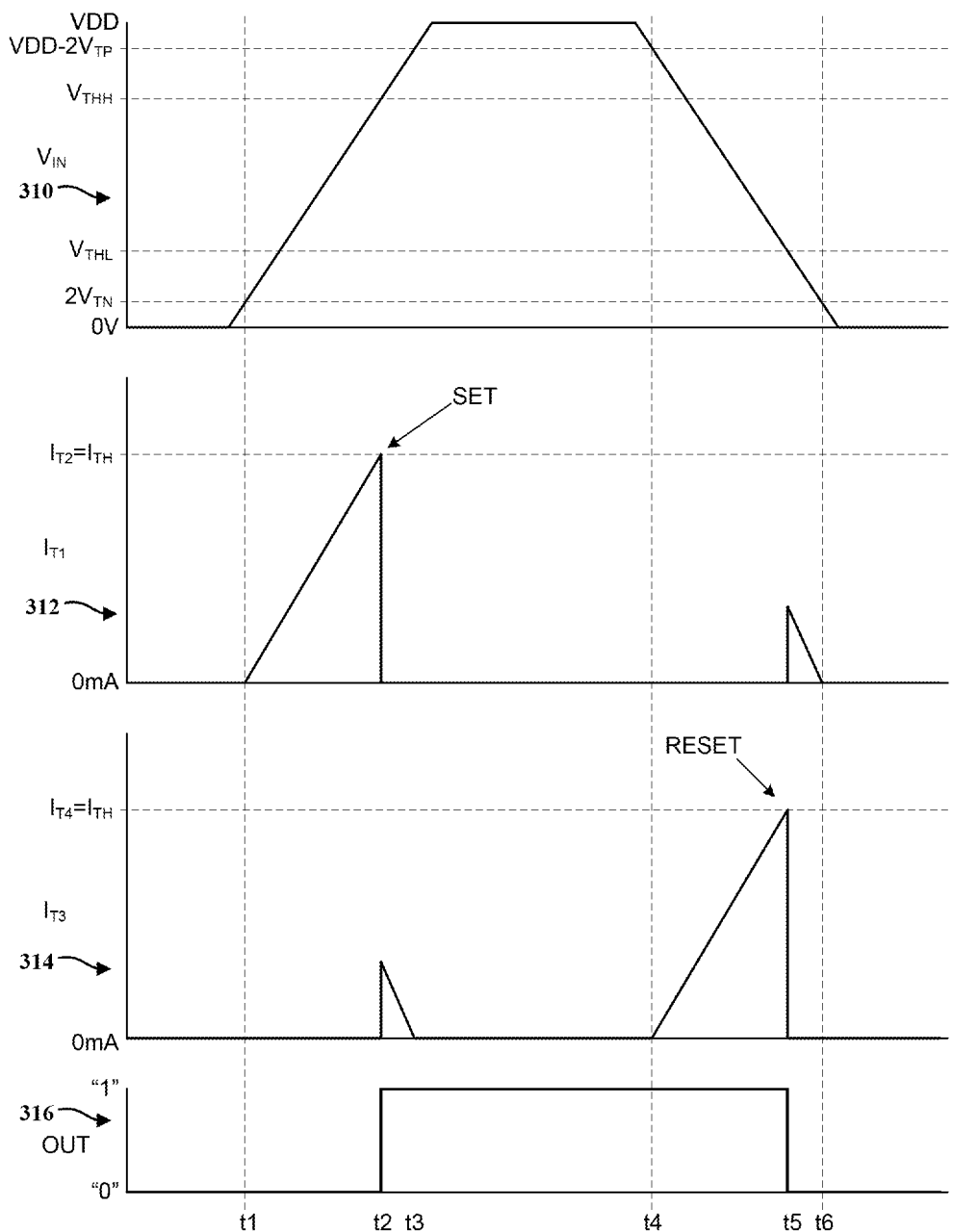
FIG. 3 shows plots characterizing operation of an input driver circuit, in accordance with one or more embodiments.

FIG. 3 shows plots characterizing operation of an input driver circuit, in accordance with one or more embodiments. By way of example, the following discussion refers to implementation of the operational characteristics shown in FIG. 3, with the circuit shown in FIG. 2. However, such operational aspects may be implemented in connection with a variety of different types of circuits.

Referring to plot 310, the input voltage $V_{IN}$ is shown. As the input voltage rises at time t1, the input voltage is about two times the threshold voltage ($V_T$) of transistor 201 (when resistor 211 is about equal in value to resistor 212), and the transistor 201 starts to conduct current. At time t2, the current in transistor 201 ($I_{T1}$, as shown in plot 312) is about equal to the current of transistor 202, as controlled via the buffer circuit and voltage between resistors 214 and 215. The switching threshold for the latch 220 (for a SET state) calculates as:

$$I_{T1} = I_{T2} \Rightarrow V_{GS1}$$
$$= V_{GS2} \Rightarrow \frac{V_{IN} \cdot R_2}{R_1 + R_2}$$
$$= \frac{V_{DD} \cdot R_5}{R_3 + R_4 + R_5}; R_1$$
$$= R_2; R_3$$
$$= R_4 = R_5 \Rightarrow V_{THH} = V_{IN} = \frac{2}{3} \cdot V_{DD}$$

This will set the latch 220 as shown in plot 312, and sets the output of the latch to a logical "1" (e.g., by switching the output from a logical "0" for a RESET state, to the logical "1"), as shown in plot 316. The output of the buffer 230 also rises in voltage level to VDD, via which the current in transistor 201 drops to zero and transistor 203 starts to conduct. At time t3, the current in transistor 203 falls to zero again.

In response to a falling input voltage, as represented at time t4 at which the input voltage is below $V_{DD}$-2$V_{TP}$ (with resistors 211 and 212 being about equal), transistor 203 starts to conduct current. At time t5 the current in transistor 203 equals the current of transistor 204, and the switching threshold of the latch 220 (for the RESET state) calculates as:

$$I_{T3} = I_{T4} \Rightarrow V_{GS3}$$
$$= V_{GS4} \Rightarrow \frac{(V_{DD} - V_{IN}) \cdot R_2}{R_1 + R_2}$$
$$= \frac{V_{DD} \cdot R_3}{R_3 + R_4 + R_5}; R_1$$
$$= R_2; R_3$$
$$= R_4$$
$$= R_5 \Rightarrow V_{DD} - V_{IN}$$
$$= \frac{2}{3} \cdot V_{DD} \Rightarrow V_{THL}$$
$$= V_{IN} = \frac{1}{3} \cdot V_{DD}$$

This will reset the latch as shown in plot 314, and set the output of the latch to a logical "0" (e.g., by changing the output from a logical "1" in the SET state to the logical "0" in the RESET state), as shown on plot 316. At this time, the output of the buffer 230 falls to ground level and, in response, the current in transistor 203 drops to zero while transistor 201 starts to conduct. At time t6, the current in transistor 201 has fallen to zero again.

Figure 4:
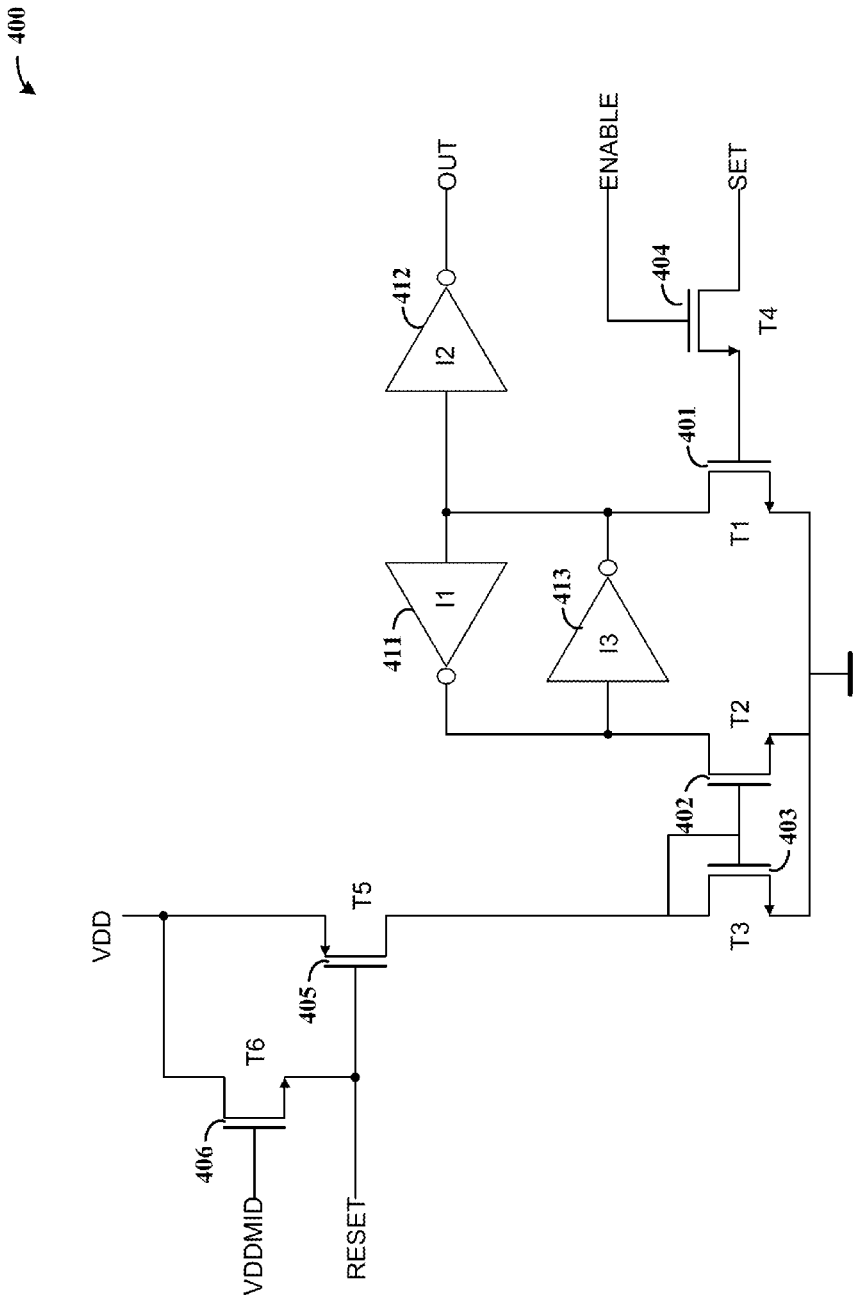
FIG. 4 shows a latch circuit as may be implemented in accordance with one or more embodiments.

A variety of types of latches or other types of logical circuits may be implemented to provide an output as discussed above, in response to respective mirrored currents (e.g., operable using the SET and RESET type inputs). FIG. 4 shows an example of such a latch circuit 400, as may be implemented in accordance with one or more embodiments. The circuit 400 includes transistors 401-406 (T1-T6), and logic inverters 411-413 (I1-I3). Respective input values for SET as shown can swing in voltage level between ground and VDD, and voltage on RESET is clamped by transistor 406 to VDDMID-VT. The signals ENABLE and OUT are digital signals with voltage levels corresponding to a logic voltage supply (e.g. 1.8V core logic supply, such as shown in FIG. 1), and the logic inverters 411-413 are also powered by the logic voltage supply. The VDDMID input is a voltage level provided at half the VDD supply. Transistors 404 and 405 have a (e.g., maximum) drain-source break-down that is higher than the (e.g., maximum) VDD voltage, and transistors 401, 402, 403 and 406 are low voltage transistors.

In the steady state in which $V_{IN}$ is equal to 0V, SET=0V and RESET=VDD, resulting in zero current consumption. The OUT signal is determined by the latch formed by inverter 411 and 413. When the SET input rises to the level of VDD, current starts to flow in transistor 401, placing the latch in the SET state and resulting in an output signal OUT="1". The gate of transistor 401 is protected against an overvoltage by clamping transistor 404.

When the RESET input is pulled-down, current starts to flow in transistors 405, 403 and 402, which places the latch into the RESET state, resulting in an output signal OUT="0". The gate of transistor 405 is protected against an overvoltage via clamping transistor 406, which starts to conduct current. The VDDMID voltage may be generated in a common biasing block.

Figure 5:
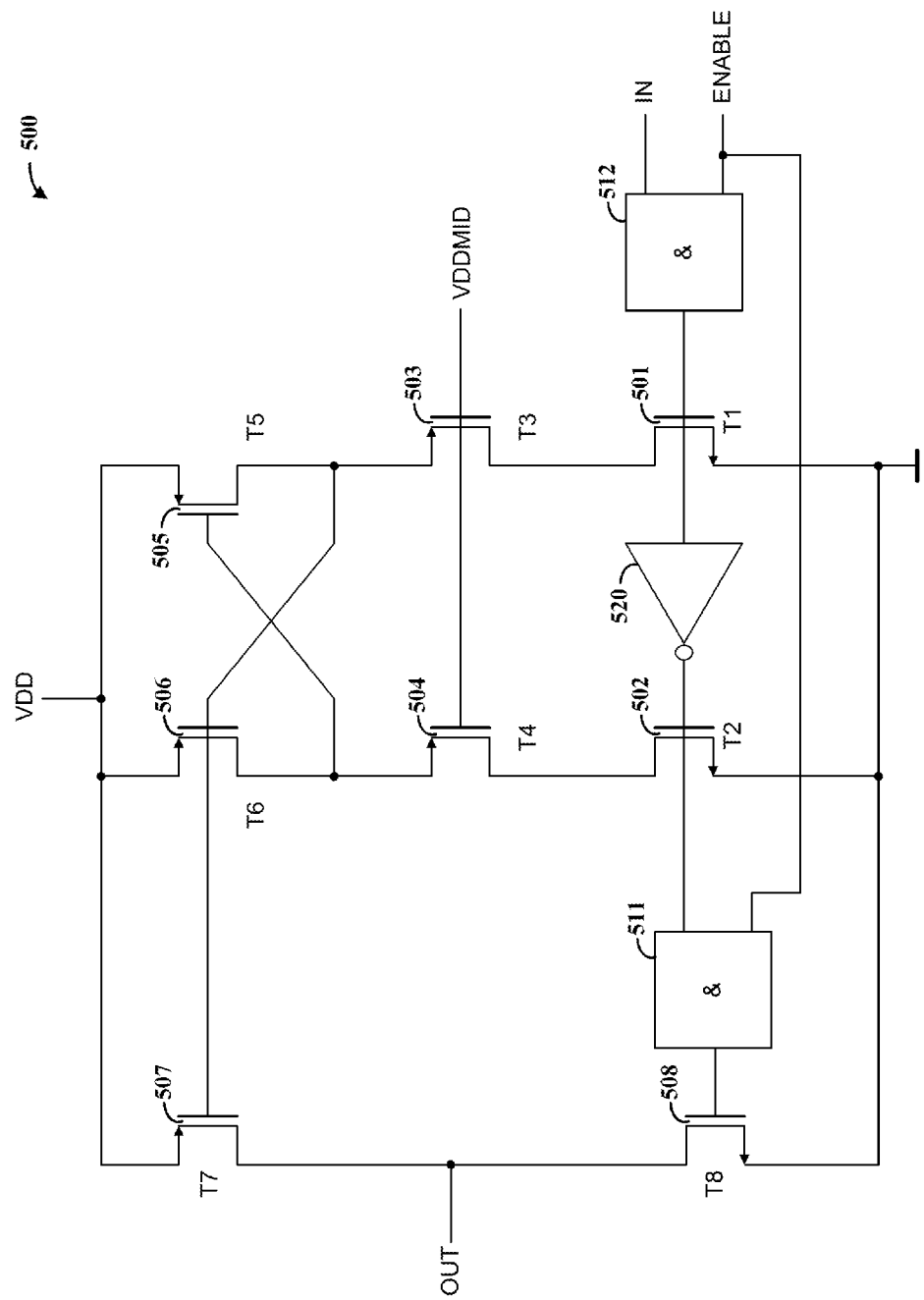
FIG. 5 shows a buffer circuit as may be implemented in accordance with one or more embodiments.

FIG. 5 shows a buffer circuit 500, as may be implemented in accordance with one or more embodiments. The circuit 500 includes transistors 501-508 (T1-T8), having a breakdown voltage larger than VDD, adding logic circuits 511 and 512, and an inverter 520. This approach may involve implementation as a high-voltage level shifter, in which transistors 503 and 504 limit a maximum gate-source drive of transistors 505-507, with half the VDD supply voltage. The buffer output at OUT is generated using transistors 507 and 508. In some implementations, such as when implemented in connection with FIG. 2, propagation delay of the buffer does not affect and/or has little effect upon propagation delay in the input cell, as the buffer output has finished its transition before the input voltage changes to the opposite phase (when the latch has changed it state).

Figure 6:
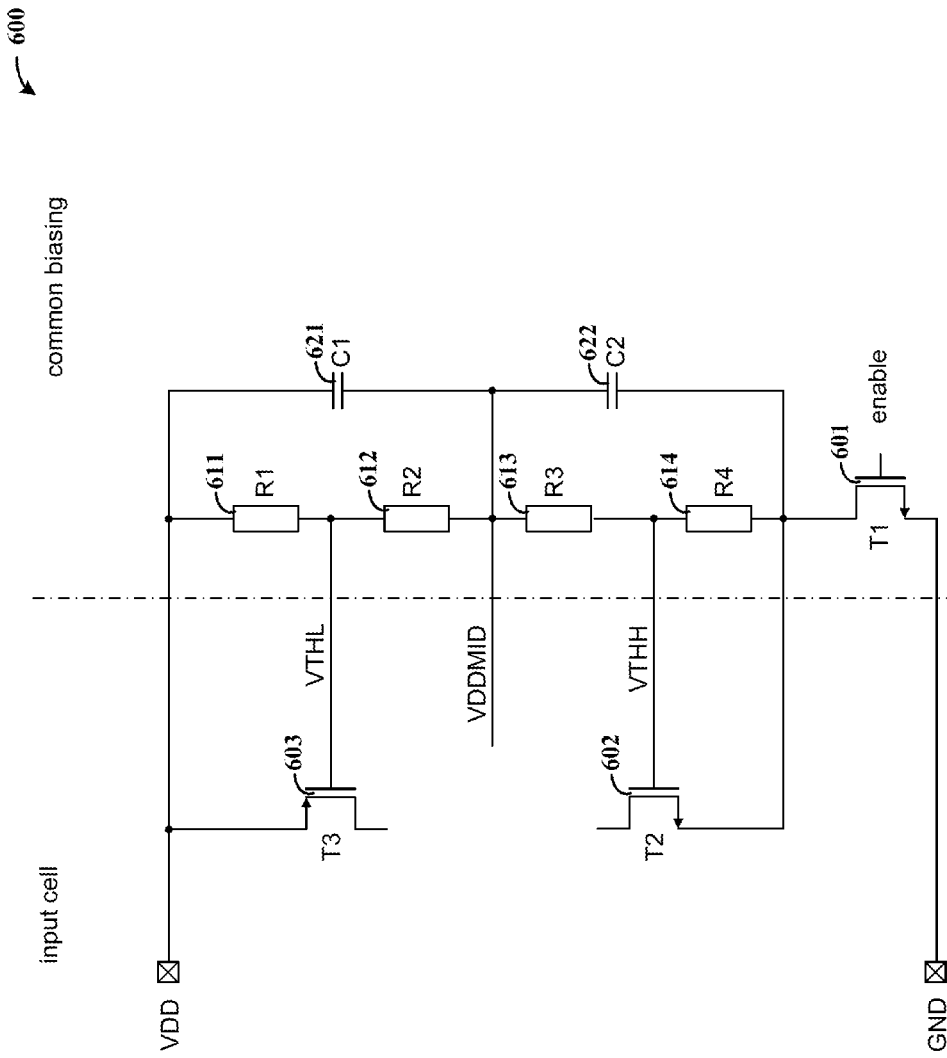
FIG. 6 shows a voltage generation circuit as may be implemented in accordance with one or more embodiments.

FIG. 6 shows a voltage generation circuit 600 as may be implemented in accordance with one or more embodiments. The circuit 600 includes transistors 601-603 (T1-T3) in which transistor 601 operates to enable the circuit, resistors 611-614 (R1-R4), and capacitors 621-622 (C1-C2). In some implementations, the circuit 600 is used to generate half of a VDD voltage and may, for example, be implemented in the biasing portion of FIG. 2. In some implementations, switching gate current connected to VDDMID that can disturb the voltage level, as may be due to high ohmic resistors used to lower quiescent current, is mitigated by decoupling capacitors 621 and 622 (e.g., implemented with the same value). These capacitors can be made, for example, with 3.3V gate-oxide capacitors.

Various blocks, modules or other circuits may be implemented to carry out one or more of the operations and activities described herein and/or shown in the figures, such as may be implemented to generate control signals, process feedback signals, or otherwise control a communication signal driver. In these contexts, a "block" (also sometimes "logic circuitry" or "module") is a circuit that carries out one or more of these or related operations/activities (e.g., a communication circuit). For example, in certain of the above-discussed embodiments, one or more modules are discrete logic circuits or programmable logic circuits configured and arranged for implementing these operations/activities, as in the circuit modules shown in the Figures. In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Certain embodiments are directed to a computer program product (e.g., nonvolatile memory device), which includes a machine or computer-readable medium having stored thereon instructions which may be executed by a computer (or other electronic device) to perform these operations/activities.

Based upon the above discussion and illustrations, those skilled in the art will readily recognize that various modifications and changes may be made to the various embodiments without strictly following the exemplary embodiments and applications illustrated and described herein. For example, different arrangements of transistors and resistors may be implemented to generate mirror current and reference current, with similar effect. Such modifications do not depart from the true spirit and scope of various aspects of the invention, including aspects set forth in the claims.

What is claimed is:

1. An apparatus comprising:
   a power rail;
   a common rail;
   a set-reset latch configured and arranged to provide first and second output states based upon respective set and reset values presented thereto, wherein a buffer is connected between an output of the set-reset latch and an input port;
   a bias circuit connected to the power and common rails and configured and arranged with
      a first current path configured and arranged to provide a first reference current, and
      a second current path configured and arranged to provide a second reference current;
   a first current-mirroring circuit connected to the power rail and configured and arranged to, in response to a voltage level presented at the input port transitioning in a first direction between voltage levels, provide a first mirrored current and operate the set-reset latch in the first output state based upon the first mirrored current and the first reference current; and
   a second current-mirroring circuit connected to the common rail and configured and arranged to, in response to a voltage level presented at the input port transitioning in a second direction that is opposite the first direction, provide a second mirrored current and operate the set-reset latch in the second output state based upon the second mirrored current and the second reference current.

2. The apparatus of claim 1,
   wherein the power rail provides a high voltage level,
   wherein the common rail provides a low voltage level that is lower than the high voltage level,
   wherein the current mirroring circuits include transistors having a gate oxide operable at a voltage level that is between the high and low voltage levels, and
   further including an impedance circuit coupled to the input port and to the current mirroring circuits, the impedance circuit being configured and arranged with the power rail and current mirroring circuits to provide the low voltage level to the transistors.

3. The apparatus of claim 1, wherein the bias circuit is configured and arranged with resistors that set values of the first and second reference currents, thereby setting threshold mirror currents upon which the set-reset latch is respectively switched to the first and second output states.

4. The apparatus of claim 1, wherein
the first current-mirroring circuit is configured and arranged to operate the set-reset latch in the first output state based upon a ratio between the first mirrored current and the first reference current, and
the second current-mirroring circuit is configured and arranged to operate the set-reset latch in the second output state based upon a ratio between the first mirrored current and the first reference current.

5. The apparatus of claim 1, wherein
the first current-mirroring circuit includes a first transistor that has a source and drain respectively coupled in series between the power rail and the input port, and at least one transistor configured and arranged to provide a current that mirrors a current through the first transistor and to flow current based upon a signal presented at the input port, and
the second current-mirroring circuit includes a second transistor that has a source and drain respectively coupled in series between the input port and the common rail, and at least one transistor configured and arranged to provide a current that mirrors a current through the second transistor and to flow current based upon a signal presented at the input port.

6. The apparatus of claim 5, further including
a first resistor connected in series between the input port and a gate of the first transistor, and between the input port and a gate of the second transistor,
a second resistor connected in series between the gate and source of the first transistor, and between the gate and source of the second transistor, the first and second resistors being equal in resistance.

7. The apparatus of claim 6, wherein the first and second resistors are respectively configured and arranged to set a level of the first and second mirrored currents.

8. The apparatus of claim 5, wherein
the set-reset latch has a set input and a reset input, and is configured and arranged to provide the first output state based upon a set value presented to the set input, and to provide the second output state based upon a reset value presented to the reset input,
the first current-mirroring circuit is configured and arranged to provide the first mirrored current to the set input,
the second current-mirroring circuit is configured and arranged to provide the second mirrored current to the reset input,
the first current path includes a third transistor connected in series between the set input and the common rail, the third transistor matching the first transistor, and
the second current path includes a fourth transistor connected in series between the power rail and the reset input, the fourth transistor matching the second transistor.

9. The apparatus of claim 5, wherein
the at least one transistor of the first current-mirroring circuit includes
a transistor having a source connected to the power rail and a drain connected to the source of the first transistor, and
another transistor having a source connected to the power rail, and a drain connected to a set input of the set-reset latch, the transistors of the first current-mirroring circuit having gates connected to one another being configured and arranged with the first current path of the bias circuit to provide a current that mirrors current in the first transistor to the set input; and the at least one transistor of the second current-mirroring circuit includes
a transistor having a source connected to the power rail and a drain connected to the source of the first transistor, and
another transistor having a source connected to the power rail and a drain connected to a reset input of the set-reset latch, the transistors of the second current-mirroring circuit having gates connected to one another being configured and arranged with the second current path of the bias circuit to provide a current that mirrors current in the second transistor to the reset input.

10. The apparatus of claim 1, further including a buffer connected between an output of the set-reset latch and the input port.

11. The apparatus of claim 1, wherein the bias circuit and the current-mirroring circuits are configured and arranged to provide an input to the set-reset latch in the current domain, in response to an input in the voltage domain received on the input port.

12. The apparatus of claim 1, wherein the bias circuit includes resistors configured and arranged to set a reference current value that controls the set-reset latch in the first and second output states, relative to current values provided via the first and second current-mirroring circuits.

13. The apparatus of claim 1, wherein the first current-mirroring circuit is symmetrical with the second current-mirroring circuit.

14. The apparatus of claim 1, wherein the bias circuit includes a switch and is configured and arranged to control operation of the current-mirroring circuits in on and off states based upon a state of the switch.

15. The apparatus of claim 1, wherein the bias circuit and the current-mirroring circuits are configured and arranged to operate in a current-blocking state when the set-reset latch is in the set state and when the set-reset latch is in the reset state.

16. An apparatus comprising:
a bias circuit connected between power and common rails and configured and arranged with a first current path that provides a first reference current, and a second current path that provides a second reference current;
a current-mirroring circuit configured and arranged to
provide a first mirrored current in response to a voltage level presented at an input port that is coupled to a buffer, transitioning in a first direction between voltage levels, and
provide a second mirrored current in response to a voltage level presented at the input port transitioning in a second direction that is opposite the first direction; and
a logic circuit configured and arranged with the bias circuit and current-mirroring circuit to generate an output corresponding to a voltage level on the input port by
operating in a first state based upon the first mirrored current and the first reference current, and
operating in a second state based upon the second mirrored current and the second reference current.

17. The apparatus of claim 16, wherein
the current-mirroring circuit includes
a first transistor that has a source and drain respectively coupled in series between a power rail and the input port, and at least one transistor configured and arranged to provide a current that mirrors a current through the first transistor and to flow current based upon a signal presented at the input port, and a second transistor that has a source and drain respectively coupled in series between the input port and the common rail, and at least one transistor configured and arranged to provide a current that mirrors a current through the second transistor and to flow current based upon a signal presented at the input port; and the current-mirroring circuit is configured and arranged to operate the logic circuit in the first output state based upon a ratio between the first mirrored current and the first reference current, and to operate the logic circuit in the second output state based upon a ratio between the first mirrored current and the first reference current.

18. A method comprising:

providing a set-reset latch that is connected to an input port via a buffer, configured and arranged to operate in first and second output states based upon respective set and reset values;

providing first and second reference currents respectively via first and second current paths between power and common rails;

in response to a voltage level presented at an input port transitioning in a first direction between voltage levels, operating the set-reset latch in the first output state by providing a first mirrored current, using the power rail, and the first reference current to the set-reset latch; and in response to a voltage level presented at the input port transitioning in a second direction that is opposite the first direction, operating the set-reset latch in the second output state by providing a second mirrored current, using the common rail, and the second reference current to the set-reset latch.

19. The method of claim 18, further including providing a high voltage level via the power rail and a low voltage level via the common rail, the low voltage level being lower than the high voltage level; and wherein providing the first and second mirrored currents include using current mirroring circuits including transistors having a gate oxide operable at a voltage level that is between the high and low voltage levels, by using an impedance circuit to provide a voltage to the transistors that is between the high and low voltage levels, using voltage provided via the power rail.

20. The method of claim 19, wherein providing the first mirrored current includes using a first transistor having a source and drain respectively coupled in series between the power rail and the input port, and using at least one transistor to generate a current that mirrors current in the first transistor, based upon a signal presented at the input port, and providing the second mirrored current includes using a second transistor having a source and drain respectively coupled in series between the input port and the common rail, and using at least one transistor to generate a current that mirrors current in the second transistor, based upon a signal presented at the input port.

21. An apparatus comprising:

a power rail;

a common rail;

a set-reset latch configured and arranged to provide first and second output states based upon respective set and reset values presented thereto;

a bias circuit connected to the power and common rails and configured and arranged with a first current path configured and arranged to provide a first reference current, and a second current path configured and arranged to provide a second reference current;

a first current-mirroring circuit connected to the power rail and configured and arranged to, in response to a voltage level presented at an input port transitioning in a first direction between voltage levels, provide a first mirrored current and operate the set-reset latch in the first output state based upon the first mirrored current and the first reference current, wherein the first current-mirroring circuit includes a transistor and a resistor is connected in series between the input port and a gate of the transistor; and a second current-mirroring circuit connected to the common rail and configured and arranged to, in response to a voltage level presented at the input port transitioning in a second direction that is opposite the first direction, provide a second mirrored current and operate the set-reset latch in the second output state based upon the second mirrored current and the second reference current.

* * * * *